(12) United States Patent
Baum et al.

(10) Patent No.: US 6,396,257 B1
(45) Date of Patent: May 28, 2002

(54) TEST HEAD MANIPULATOR FOR SEMICONDUCTOR TESTER WITH MANUAL ASSIST FOR VERTICAL TEST HEAD MOVEMENT

(75) Inventors: Joel H. Baum, Potomac, MD (US); David A. Baker, Hillsboro, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/558,875

(22) Filed: Apr. 26, 2000

(51) Int. Cl.[7] .............................................. G01R 31/02
(52) U.S. Cl. ..................... 324/158.1; 324/758; 414/590
(58) Field of Search ............................. 324/158.1, 758; 414/590

(56) References Cited

U.S. PATENT DOCUMENTS

| | | | |
|---|---|---|---|
| 4,527,942 A | * 7/1985 | Smith | 414/590 |
| 4,755,746 A | 7/1988 | Mallory et al. | |
| 5,241,870 A | * 9/1993 | Holt | 324/158.1 |
| 5,384,531 A | 1/1995 | Yamazaki et al. | |
| 5,450,766 A | * 9/1995 | Holt | 324/158.1 |
| 5,818,219 A | * 10/1998 | Hama et al. | 324/158.1 |
| 5,821,440 A | 10/1998 | Khater et al. | |
| 5,903,164 A | 5/1999 | Kline | |
| 6,006,616 A | 12/1999 | Baker | |

* cited by examiner

*Primary Examiner*—Michael J. Sherry
*Assistant Examiner*—Jimmy Nguyen
(74) *Attorney, Agent, or Firm*—John Smith-Hill; Smith-Hill and Bedell

(57) ABSTRACT

A test head manipulator for a semiconductor integrated circuit tester includes a support frame, a vertical guide attached to the support frame, a carriage mounted on the vertical guide and movable vertically therealong, a manipulator arm attached to the carriage and projecting therefrom, a counterbalance assembly mounted to the support frame for vertical movement relative thereto, a drum mounted to the support frame for rotation about a horizontal axis, a flexible tension member trained over the drum and having one end connected to the carriage and an opposite end connected to the counterbalance assembly whereby upward movement of the carriage is accompanied by downward movement of the counterbalance assembly and downward movement of the carriage is accompanied by upward movement of the counterbalance assembly, a hand operated power input element at a fixed height relative to the drum, and a force transmission mechanism which couples the power input element to the drum for transmitting manual effort from the power input element to the drum for raising or lowering the carriage.

9 Claims, 4 Drawing Sheets

TEST HEAD MANIPULATOR FOR SEMICONDUCTOR TESTER WITH MANUAL ASSIST FOR VERTICAL TEST HEAD MOVEMENT

BACKGROUND OF THE INVENTION

This invention relates to a test head manipulator for a semiconductor integrated circuit tester with manual assist for vertical test head movement.

Certain subject matter disclosed in this application is also disclosed in U.S. Pat. Nos. 5,821,440, 6,006,616 and 6,023,173, the entire disclosure of each of which is hereby incorporated by reference herein for all purposes.

A known type of semiconductor integrated circuit tester includes a test head having an array of terminals exposed at an interface surface of the test head for engaging corresponding terminals of a load board on which a semiconductor device under test (DUT) is mounted in order to effect electrical connection between the terminals of the test head and corresponding pins of the DUT.

The tester is used in conjunction with an interfacing mechanism, such as a wafer prober or an integrated circuit device handler, for delivering semiconductor devices in succession to a test location at which an individual DUT is mounted to the load board and a test is performed. There are numerous makes and models of such interfacing mechanisms and different interfacing mechanisms have different requirements for the orientation of the DUT in the test location. A given tester should be useable with a variety of these interfacing mechanisms and it may be necessary from time to time to change the location and/or orientation of the test head. For this purpose, the test head is attached to a manipulator which permits horizontal and vertical movement of the test head and may also permit rotational movement of the test head.

When the tester is to be used with a different interfacing mechanism, the operator must carefully position the test head at the proper location and in the proper orientation to engage the load board. It is necessary to avoid collision when the test head is moved or re-oriented since this may cause damage to the test head or other equipment. Generally, a skilled and careful human operator is able to position the test head with a high degree of precision.

The moving mass of the test head may be quite substantial. It is known to use a counterbalance to support the weight of the test head and reduce the effort required to move the test head vertically upwards, but even if the weight of the counterbalance is equal to the weight of the test head, substantial forces may still be necessary to bring about vertical movement of the test head since it is necessary to overcome the inertia of rest and frictional resistance. This may make it difficult for a slightly built operator to position the test head vertically with the required degree of precision.

If the operator raises or lowers the test head by applying manual effort directly to the test head, for example by a handle attached to the test head, the height of the point of application of effort changes as the test head moves and accordingly the stance of the operator must change. This change in stance of the operator, e.g. from a stooping position to stretching upwards in an extreme case, can interfere with the operator's ability to observe clearly the position of the test head relative to surrounding equipment and to exercise fine control over the movement of the test head, increasing the likelihood of collision.

U.S. Pat. No. 6,006,616 discloses a manipulator which includes an electric servo or other drive device to assist vertical movement of the test head and counterbalance. The servo reduces the effort required on the part of the operator to overcome the inertia of rest and frictional resistance. However, it has been found that the operator may nevertheless experience difficulty in positioning the test head vertically with the required degree of precision.

SUMMARY OF THE INVENTION

In accordance with the invention there is provided a test head manipulator for a semiconductor integrated circuit tester including a support frame, a vertical guide means attached to the support frame, a carriage mounted on the vertical guide means and movable vertically therealong, a manipulator arm attached at a proximal end to the carriage and projecting therefrom, there being a test head attached to the manipulator arm at a proximal end thereof, a counterbalance assembly mounted to the support frame for vertical movement relative thereto, a drum mounted to the support frame for rotation about a horizontal axis, a flexible tension member trained over the drum and having one end connected to the carriage and an opposite end connected to the counterbalance assembly whereby upward movement of the carriage is accompanied by downward movement of the counterbalance assembly and downward movement of the carriage is accompanied by upward movement of the counterbalance assembly, a hand operated power input element at a fixed height relative to the drum, and a force transmission mechanism which couples the power input element to the drum for transmitting manual effort from the power input element to the drum for raising or lowering the carriage.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
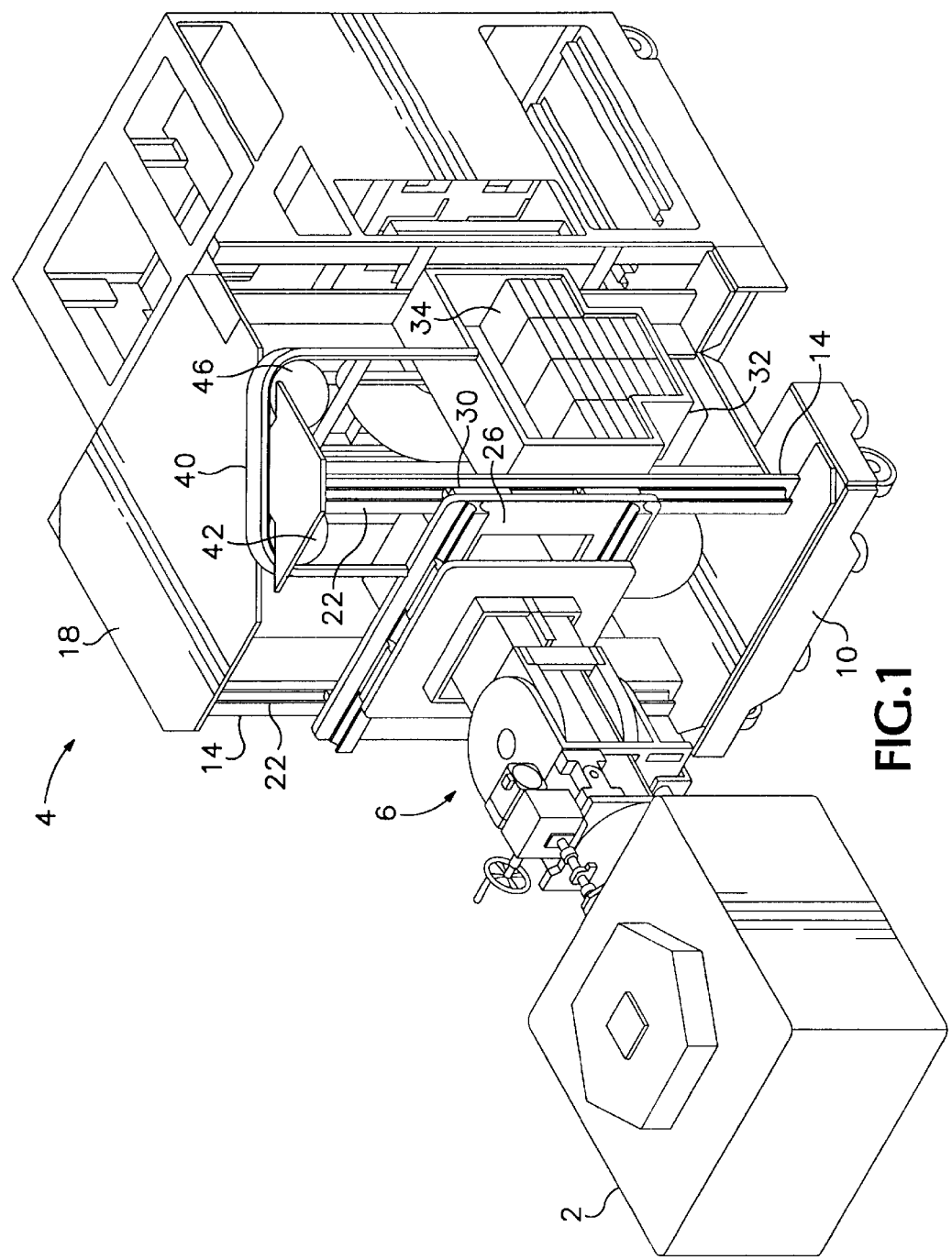
FIG. 1 is a perspective view of a manipulator in accordance with the present invention.

The illustrated manipulator is used to support a test head 2 and includes a support frame 4 and a manipulator arm 6. The support frame 4 includes a base 10, vertical columns 14 and a top plate 18. Vertical rails 22 are rigidly attached to two of the columns 14. The manipulator arm 6 includes a vertical rail plate 26. Vertical bearings 30 are rigidly attached to the vertical rail plate 26 and engage the vertical rails 22 respectively, and accordingly the manipulator arm 6 is able to move vertically with respect to the frame 4.

Figure 4:
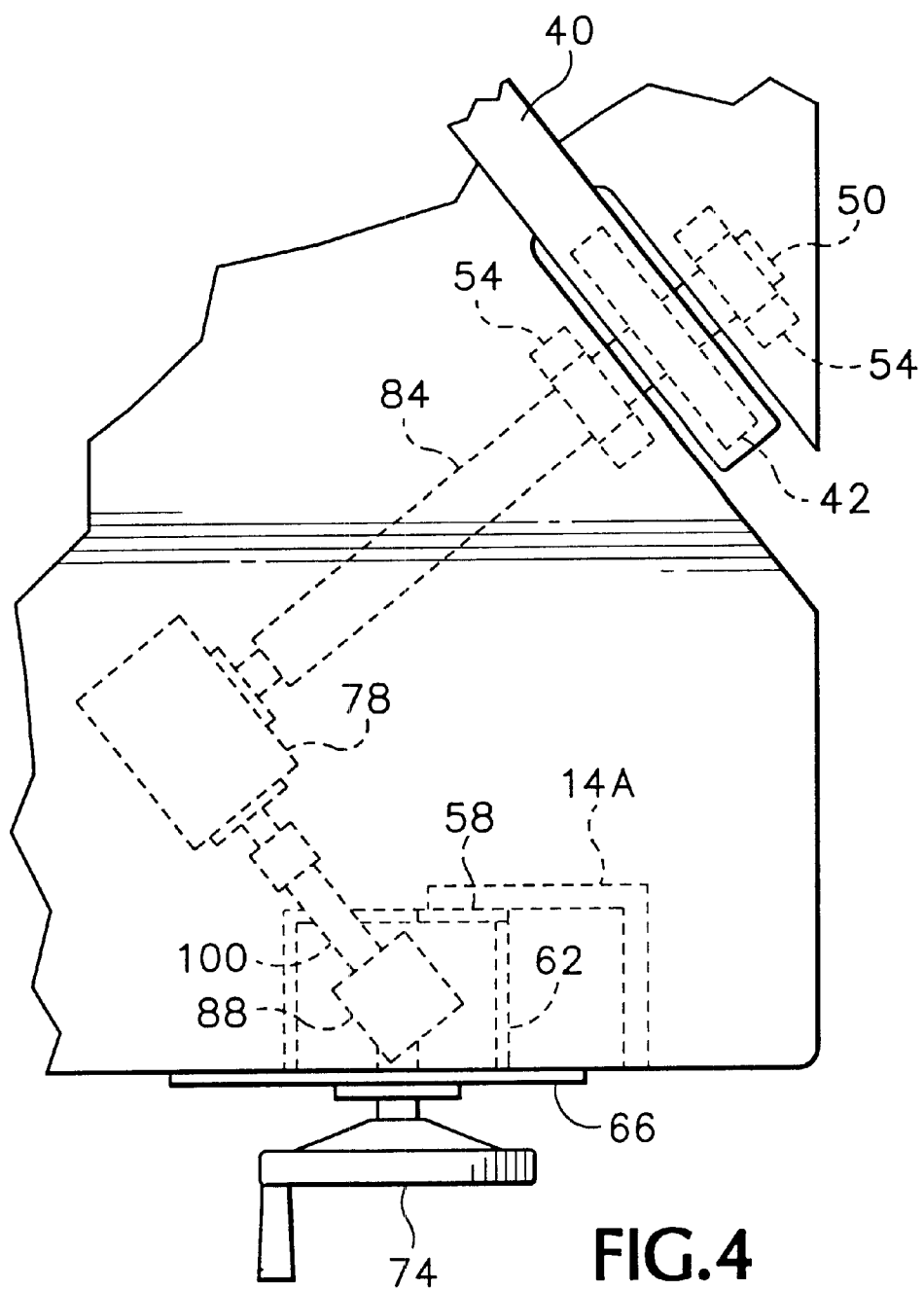
FIG. 4 is a partial top plan view of the manipulator.

The test head 2 and manipulator arm 6 have a mass of several hundred pounds or more. The vertical rail plate 26 is connected to a counterbalance tray 32, containing counterbalance weight elements 34 to offset the weight of the test head and manipulator arm, by a chain 38 (FIG. 4) which extends vertically upward from the vertical rail plate 26, over two horizontally spaced sprocket wheels 42 and 46 which are journalled for rotation about respective parallel horizontal axes, and vertically downward to the counterbalance tray 30. The chain 38 is provided with a flexible protective cover 40. FIG. 4 illustrates the sprocket wheel 42 having a shaft 50 journalled in bearings 54 which are mounted relative to the top plate 18 by bearing supports (not shown). The sprocket wheel 46 is mounted in similar manner. The mass of the counterbalance tray and counterbalance weight elements is substantially equal to the mass of the manipulator arm and test head, and accordingly the test head can be moved vertically using a force sufficient to overcome the inertia of rest of the masses that are moved and the dynamic frictional resistance to motion.

The test head is provided with handles (not shown) which can be gripped by the operator in order to move the test head vertically.

It is very important that the movement of the test head be carefully controlled and that collision be avoided. For example, when the test head is in the orientation shown in FIG. 1, upward vertical movement of the test head brings about engagement with the load board, and if the test head moved upward without careful control, there could be a collision with the load board causing damage to the load board and/or to the test head itself.

Because of the large mass of the counterbalance tray and its contents and the manipulator arm and test head, the force required to overcome the inertia of rest of the movable masses is quite large. Accordingly, an operator may experience difficulty in moving the test head vertically, either up or down, by applying effort to the handles on the test head.

The manipulator includes a manual assist mechanism which allows the operator to raise or lower the manipulator arm without an external source of power but nevertheless requiring less effort than would be required if the effort were applied to the handles attached to the test head. The manual assist mechanism includes a weldment which is attached to the column 14A and comprises a base plate 58, two standoff flanges 62 projecting from the base plate 58 and a mounting plate 66 attached to the stand-off flanges and parallel to and spaced from the base plate. A right angle gear box 70 is attached to the mounting plate 66 and is accommodated in the space bounded by the base plate, the mounting plate and the two stand-off flanges. The gear box 70 has an input shaft which extends horizontally through the mounting plate and is provided with a handwheel 74 and an output shaft which extends vertically upwards, adjacent to the column 14A.

A second right angle gear box 78, which incorporates a high ratio reduction gear, is attached to the top plate of the manipulator support frame through a spacer 80. The thickness of the spacer is selected to position the output shaft of the gear box 78 at the height of the shaft 50 of the sprocket wheel 42 and the gear box 78 is positioned relative to the top plate 18 so that the output shaft of the gear box is aligned with the shaft 50. The output shaft of the gear box 78 is connected to the shaft 50 by a coupling shaft 84.

A third right angle gear box 88 is mounted to the support frame 4 by a bracket 92 attached to the top plate 18. The input shaft of the gear box 88 is vertical and is presented downwards and the output shaft of the gear box is horizontal. The bracket 92 positions the gear box 88 so that its output shaft is at the same height as the input shaft of the gear box 78 and the bracket 92 is positioned relative the top plate so that the output shaft of the gear box 88 is aligned with the input shaft of the gear box 78 and the input shaft of the gear box 88 is aligned with the output shaft of the gear box 70. A coupling shaft 96 connects the output shaft of the gear box 70 to the input shaft of the gear box 88 and a coupling shaft 100 connects the output shaft of the gear box 88 to the input shaft of the gear box 78.

It will be appreciated from the foregoing that rotational movement of the handwheel 74 is transmitted through the gear boxes and coupling shafts to the sprocket wheel 42. The force exerted by the operator on the handwheel acts on either the manipulator arm or the counterbalance tray through tension in the chain and tends to raise one movable mass while allowing the other movable mass to move downwards. Thus, in the event that the operator wishes to raise the test head, the operator turns the handwheel in one direction and the sprocket wheel 42 rotates counterclockwise when viewed along the coupling shaft 84. The torque applied to the sprocket wheel 42 by the handwheel 74 generates additional tension in the upward run of the chain and tends to pull the manipulator arm upwards. The counterbalance tray moves downward under the force of gravity, its downward motion being resisted by tension in the downward run of chain. In the event that the operator wishes to lower the test head, the sprocket wheel rotates clockwise. The torque supplied by the handwheel increases the tension in the downward run of the chain and the tension is then sufficient to lift the counterbalance tray, whereas the manipulator arm and the test head attached thereto move downward under the force of gravity, resisted by the tension in the upward run of the chain.

The height of the handwheel 74 is fixed and can be selected so that it is convenient for the average operator. Since the height of the handwheel is fixed, it is independent of the height of the manipulator arm and the operator can stand by the manipulator and view the test head while turning the handwheel and is able to observe clearly the motion of the test head as the manipulator arm is raised or lowered without being distracted by needing to change stance as the height of the test head changes. This allows the operator to exercise fine control over the vertical position of the manipulator arm. The handwheel provides tactile feedback to the operator so that the operator can more easily detect when the manipulator arm has reached a position in which the test head is engaging the DUT board.

Figure 2:
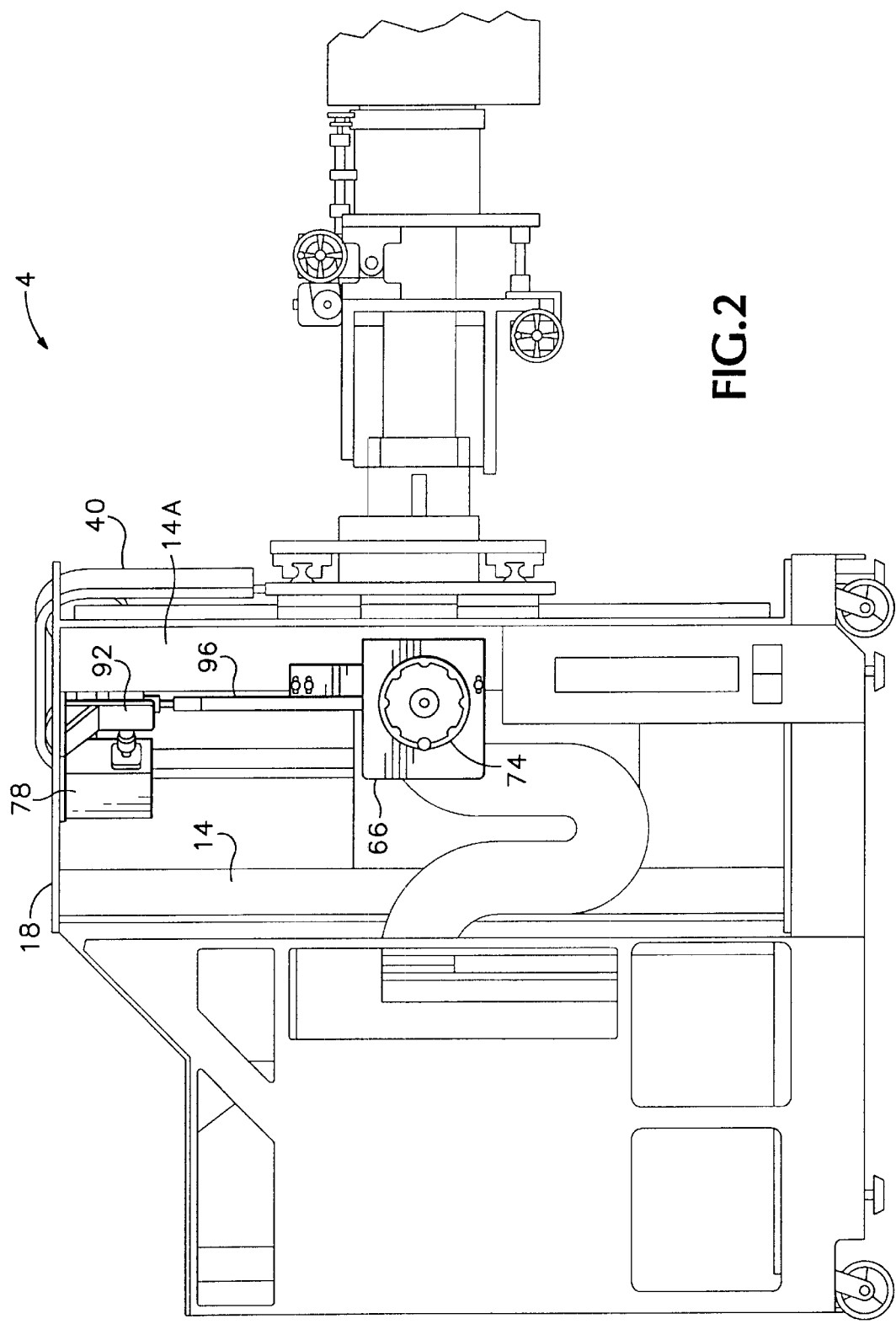
FIG. 2 is a side elevation of the manipulator.
Figure 3:
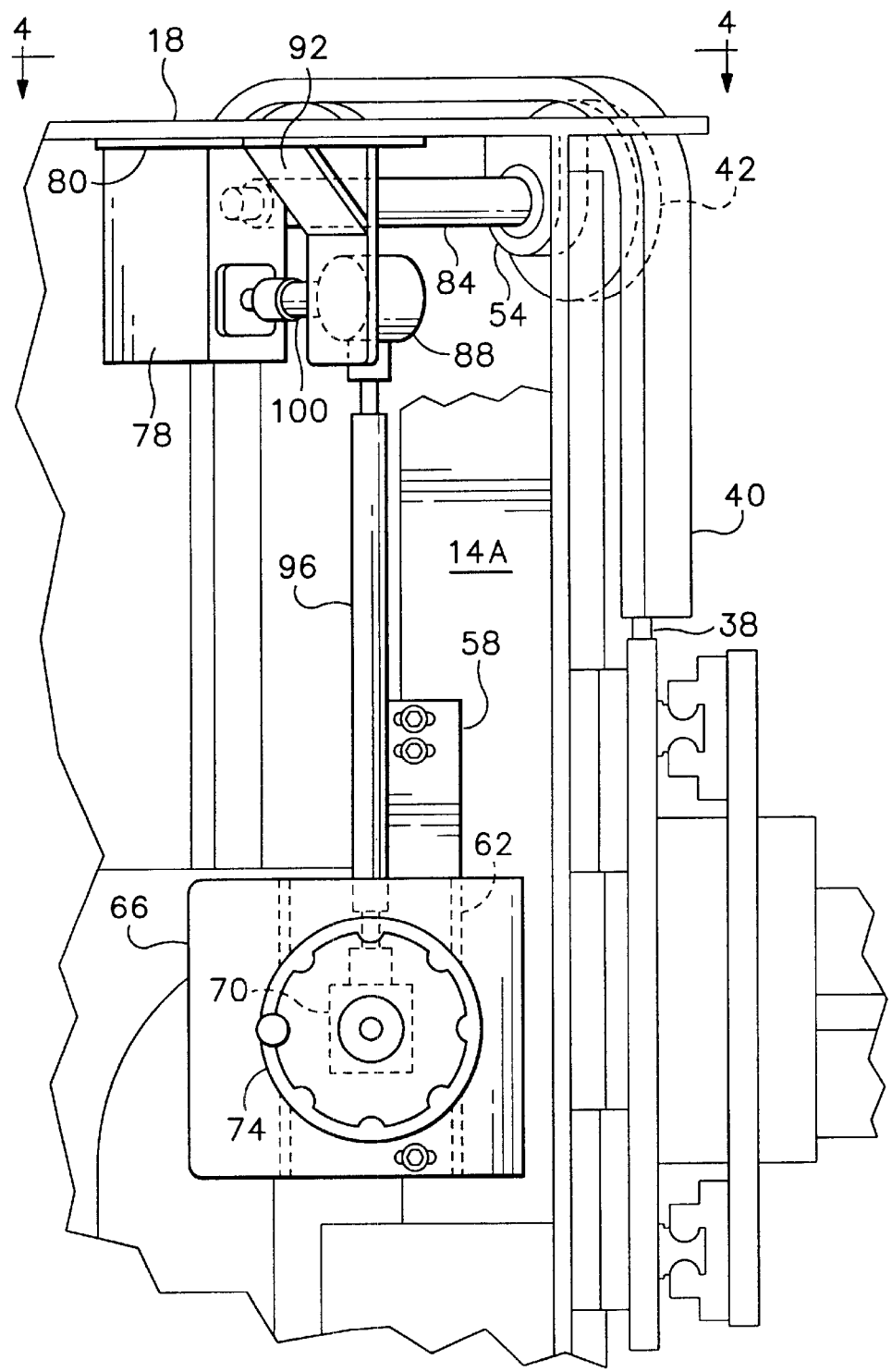
FIG. 3 is an enlarged partial side elevation of the manipulator.

The manual assist mechanism described above can be retrofitted to the manipulator described in U.S. Pat. No. 5,821,440. Particularly in the case of a retrofit, it might be difficult to ensure that a shaft of a gear box is properly aligned with the shaft to which it is to be coupled. Accordingly, the coupling shafts 84, 96 and 100 preferably include flexible connections which allow minor misalignments. Moreover, in the case of a retrofit it is possible that portions of the support frame will not permit the gear box 88 to be positioned as high as illustrated in FIGS. 2 and 3. In order to align the input shaft of the gear box 78 with the output shaft of the gear box 88 it is then necessary for the gear box 78 to be positioned with its input shaft lower relative to the shaft 50 than shown in FIGS. 2 and 3. In this case, the gear box 78 is attached to the top plate 18 of the support frame using a wedge-shaped spacer of sufficient thickness to place the input shaft of the gear box 78 at the height of the output shaft of the gear box 88. The wedge-shaped spacer is positioned so that the output shaft of the gear box 78 is inclined upwards. A universal joint (not shown) is used to connect the output shaft of the gear box 78 to the coupling shaft 84.

It will be appreciated that the invention is not restricted to the particular embodiment that has been described, and that variations may be made therein without departing from the scope of the invention as defined in the appended claims and equivalents thereof.

What is claimed is:

1. A test head manipulator for a semiconductor integrated circuit tester including:

a support frame, a vertical guide means attached to the support frame, a carriage mounted on the vertical guide means and movable vertically therealong, a manipulator arm attached at a proximal end to the carriage and projecting therefrom, there being a test head attached to the manipulator arm at a proximal end thereof, a counterbalance assembly mounted to the support frame for vertical movement relative thereto, a drum mounted to the support frame for rotation about a horizontal axis, a flexible tension member trained over the drum and having one end connected to the carriage and an opposite end connected to the counterbalance assembly whereby upward movement of the carriage is accompanied by downward movement of the counterbalance assembly and downward movement of the carriage is accompanied by upward movement of the counterbalance assembly, a hand operated power input element at a fixed height relative to the drum, and a force transmission mechanism which couples the power input element to the drum for transmitting manual effort from the power input element to the drum for raising or lowering the carriage.

2. A test head manipulator according to claim 1, wherein the flexible tension member comprises a chain having one end connected to the test head assembly and an opposite end connected to the counterbalance assembly and the drum is a sprocket wheel over which the chain is trained in a first segment extending between the test head assembly and the sprocket wheel and a second segment extending between the counterbalance assembly and the sprocket wheel, and the force transmission mechanism is coupled drivingly to said sprocket wheel.

3. A test head manipulator according to claim 1, wherein the flexible tension member is a chain, the drum is a sprocket wheel in driving engagement with the chain, and the force transmission mechanism includes a rotary shaft coupled drivingly to said sprocket wheel.

4. A test head manipulator according to claim 1, wherein the force transmission mechanism includes a shaft rotatably mounted in the support frame at a fixed height relative to the drum and the hand operated power input element includes a member attached to the shaft for applying manual force to the shaft to bring about rotation of the shaft.

5. A test head manipulator according to claim 4, wherein the hand operated power input element is a handwheel attached to the shaft for applying rotational force thereto.

6. A test head manipulator according to claim 1, wherein the force transmission mechanism includes a right angle gear box which is attached to the support frame at a fixed height relative to the drum and has a horizontal input shaft and a vertical output shaft, and the hand operated power input element includes a member attached to the input shaft of the right angle gearbox for applying manual force to the input shaft to bring about rotation thereof.

7. A test head manipulator for a semiconductor integrated circuit tester including:

a support frame, a vertical guide means attached to the support frame, a carriage mounted on the vertical guide means and movable vertically therealong, a manipulator arm attached at a proximal end to the carriage and projecting therefrom, there being a test head attached to the manipulator arm at a proximal end thereof, a counterbalance assembly mounted to the support frame for vertical movement relative thereto, a drum mounted to the support frame for rotation about a horizontal axis, a flexible tension member trained over the drum and having one end connected to the carriage and an opposite end connected to the counterbalance assembly whereby upward movement of the carriage is accompanied by downward movement of the counterbalance assembly and downward movement of the carriage is accompanied by upward movement of the counterbalance assembly, a hand operated power input element at a fixed height relative to the drum, and a force transmission mechanism which couples the power input element to the drum for transmitting manual effort from the power input element to the drum for raising or lowering the carriage, and wherein the hand operated power input element includes a handwheel and the force transmission mechanism includes a first right angle gear box which is attached to the support frame and has a vertical output shaft, a second right angle gear box which is attached to the support frame and has an output shaft coupled drivingly to the drum, and a coupling means connecting the output shaft of the first gear box to an input shaft of the second gear box.

8. A test head manipulator according to claim 7, wherein the input shaft of the second gear box is horizontal and the coupling means includes a third right angle gear box having a vertical input shaft substantially aligned with the output shaft of the first gear box and a horizontal output shaft substantially aligned with the input shaft of the second gear box.

9. A test head manipulator according to claim 7, wherein the second gear box is a reduction gear box.

* * * * *